(12) United States Patent
Schmidig

(10) Patent No.: US 8,692,553 B2
(45) Date of Patent: Apr. 8, 2014

(54) MODULAR MRI PHASED ARRAY ANTENNA

(75) Inventor: Daniel Schmidig, Schaffhausen (CH)

(73) Assignee: Bruker BioSpin AG, Faellanden (CH)

( * ) Notice: Subject to any disclaimer, the term of this patent is extended or adjusted under 35 U.S.C. 154(b) by 243 days.

(21) Appl. No.: 13/137,184

(22) Filed: Jul. 27, 2011

(65) Prior Publication Data

US 2012/0025832 A1 Feb. 2, 2012

(30) Foreign Application Priority Data

Jul. 30, 2010 (DE) .......................... 10 2010 038 722

(51) Int. Cl.
*G01V 3/00* (2006.01)
(52) U.S. Cl.
USPC ........................................ 324/322
(58) Field of Classification Search
USPC .................................. 324/300–322
See application file for complete search history.

(56) References Cited

U.S. PATENT DOCUMENTS

| | | | |
|---|---|---|---|
| 4,825,162 A | 4/1989 | Roemer | |
| 4,998,066 A | 3/1991 | Wichern | |
| 5,216,368 A | 6/1993 | Leussler | |
| 5,294,886 A | 3/1994 | Duerr | |
| 5,329,233 A * | 7/1994 | Hayes | 324/318 |
| 5,351,688 A * | 10/1994 | Jones | 600/422 |
| 5,578,925 A * | 11/1996 | Molyneaux et al. | 324/318 |
| 5,594,337 A * | 1/1997 | Boskamp | 324/318 |
| 6,084,411 A | 7/2000 | Giaquinto | |
| 6,591,128 B1 * | 7/2003 | Wu et al. | 600/422 |
| 6,650,926 B1 | 11/2003 | Chan | |
| 6,759,846 B2 * | 7/2004 | Van Helvoort et al. | 324/300 |
| 6,992,486 B2 * | 1/2006 | Srinivasan | 324/318 |
| 7,215,120 B2 * | 5/2007 | Vaughan | 324/318 |
| 7,345,483 B2 * | 3/2008 | Vaughan | 324/318 |
| 7,375,527 B2 * | 5/2008 | Vaughan, Jr. | 324/318 |
| 7,659,719 B2 * | 2/2010 | Vaughan et al. | 324/318 |
| 7,728,592 B2 * | 6/2010 | Ma et al. | 324/318 |
| 7,772,842 B2 * | 8/2010 | Gao et al. | 324/307 |
| 7,859,264 B2 * | 12/2010 | Wosik et al. | 324/318 |
| 8,106,656 B2 * | 1/2012 | Wosik et al. | 324/318 |
| 2004/0124840 A1 | 7/2004 | Reykowski | |
| 2005/0174116 A1 | 8/2005 | Leussler | |
| 2006/0061362 A1 | 3/2006 | Reykowski | |
| 2007/0257670 A1 | 11/2007 | Glaquinto | |
| 2008/0238424 A1 | 10/2008 | Possanzini | |

FOREIGN PATENT DOCUMENTS

| | | |
|---|---|---|
| EP | 1 521 094 | 4/2005 |
| JP | 2004-033380 | 0/2004 |
| JP | 01-126532 | 5/1989 |
| JP | 04-246331 | 9/1992 |
| JP | 05-023318 | 2/1993 |
| JP | 2008-212437 | 9/2008 |
| WO | WO 2008/073512 | 6/2008 |

* cited by examiner

*Primary Examiner* — Dixomara Vargas
(74) *Attorney, Agent, or Firm* — Paul Vincent

(57) ABSTRACT

An antenna configuration for use in a magnetic resonance apparatus has at least two individual antennas which each include at least one conductor loop, one tuning network and one matching network, wherein the individual antennas are each combined into separate modules which are positioned on and mounted to a support body and can be removed therefrom in a non-destructive fashion, is characterized in that the individual antennas are connected to each other through decoupling elements, wherein the decoupling elements are mounted to the support body in an undetachable fashion. It is thereby possible to define individual antenna modules which can be arranged in a simple fashion around the measuring volume, are also electromagnetically decoupled from each other, and can be positioned close to the measuring volume in order to ensure that the received MRI image has a maximum, high signal-to-noise ratio.

9 Claims, 13 Drawing Sheets

MODULAR MRI PHASED ARRAY ANTENNA

This application claims Paris convention priority of DE 10 2010 038 722.3 filed Jul. 30, 2010 the entire disclosure of which is hereby incorporated by reference.

BACKGROUND OF THE INVENTION

The invention concerns an antenna configuration for use in a magnetic resonance apparatus, which is designed as a phase-controlled array and comprises at least two individual antennas each of which comprises at least one conductor loop, one tuning network and one matching network, wherein the tuning network contains at least one tuning capacitance and the matching network contains at least one matching capacitance, and the individual antennas are each combined into separate modules which are positioned on and mounted to a support body and can be removed therefrom in a non-destructive fashion.

An antenna configuration of this type is disclosed in U.S. Pat. No. 6,084,411.

The invention concerns an imaging device which utilizes nuclear magnetic resonance (NMR or MR) by using antennas (coils) which are used to transmit and/or receive frequency signals (Larmor frequency) and are combined into arrays (fields), wherein the individual antenna consists of a conductor path that defines a surface.

Nuclear magnetic resonance is widely used, being an important imaging method. It utilizes the effect that nuclear spins are excited in a homogeneous magnetic field (B0) when energy is supplied by means of electromagnetic waves of certain frequencies due to absorption. The frequency is thereby determined by the strength of the constant magnetic field (B0) and the special characteristic properties of the nucleus. After a short time, the excited spins return into their ground state, i.e. a state of lower energy, and emit a radio frequency electromagnetic signal which can be detected by receiving antennas and be used for constructing an image. It is fundamentally possible to use the same antenna elements both for excitation (transmitting) of a signal and for receiving a signal. Several antennas may be combined into so-called arrays. The larger the density, i.e. the number of individual antennas per unit area, the better the signal-to-noise ratio (SNR), which can be utilized e.g. for increasing the resolution of the derived image. One further important advantage of antenna arrays is the possibility of using parallel-imaging methods, e.g. SENSE or GRAPPA. These methods realize a higher recording speed.

The present invention concerns an antenna array consisting of several individual antennas.

In medical imaging using NMR, high-frequency magnetic fields in the MHz range are received from the body of a person or an animal by means of an RF antenna and are further processed for imaging.

A receiving antenna designed as a surface antenna (local antennas or local coils) which is adapted to the surface of the object and the area to be investigated, obtains a higher signal-to-noise ratio (SNR) in the MR image compared to that received by a whole-body antenna.

A smaller surface antenna thereby yields a higher SNR than a larger surface antenna, but also has a correspondingly smaller field-of-view (FOV, imaged area). For this reason, one often uses a plurality of smaller antennas or an array of smaller antennas instead of one individual large antenna for investigating a larger FOV. Each individual receiving antenna thereby requires its own receiving path which consists of preamplifier, cable and receiver. Devices of this type are called phased array antennas or antenna arrays.

The individual antennas are thereby generally disposed on a surface which is adapted to the geometry of the area to be investigated.

The antenna arrays have one problem due to the fact that, when several individual antennas are arranged next to one another, it may happen that a high-frequency current in one of the individual antennas induces a voltage in neighboring individual antennas. This is called coupling of antennas with respect to one another. Couplings occur both with configurations of circular polarized antennas and also with configurations of linearly polarized individual antennas. Couplings deteriorate the signal-to-noise ratio (SNR) and generate artefacts in the MR image. Examination of coupled individual antennas is moreover more demanding than examination of individual antennas that are not coupled. One aim of the design of phased array antennas is therefore to avoid coupling of individual antennas, if possible.

Decoupling Techniques

An antenna array of the above-mentioned type is described in U.S. Pat. No. 4,825,162 [1]. The antenna array comprises several individual antennas that are disposed next to one another. For decoupling, neighboring individual antennas partially overlap. This overlap reduces the mutual inductance of neighboring individual antennas. The overlap also requires that the antenna conductors cross each other, thereby generating corresponding crossing points. The antenna conductors must be guided such that they are insulated from each other at the crossing points. At higher frequencies, the capacitances formed at the crossing points moreover generate, in turn, capacitive couplings.

The above-cited document U.S. Pat. No. 4,825,162 [1] mentions a further measure to reduce couplings. It consists in selecting the impedance of a preamplifier which is connected to the individual antenna in such a fashion that an impedance, acting on the connectors of the individual antenna, which is also determined by the input resistance of the preamplifier, has a maximum value. In consequence thereof, the current induced in the individual antennas almost vanishes, whereby the voltage induced in neighboring individual antennas becomes correspondingly small and negligible. However, the expense is great for obtaining sufficient decoupling in this fashion. This type of decoupling is therefore used in practice together with other decoupling techniques. This type of decoupling is referred to as preamplifier decoupling below.

A further antenna array is described in U.S. Pat. No. 5,216,368 [3]. The antenna array comprises two antenna systems that are aligned perpendicularly with respect to one another. When these two antenna systems are exactly aligned, they are decoupled from each other solely due to their arrangement. Asymmetries, however, cause couplings of the two antenna systems which are compensated for by a capacitor which connects the two antenna systems.

DE 41 13 120 C2 [4] describes an antenna system with a standing wave trap. The standing wave trap suppresses undesired radio frequency coupling via the lines of the antenna.

DE 10 2004 046 188 A1 [5] describes an antenna array for a magnetic resonance apparatus with capacitive compensation of the inductive coupling. Neighboring individual antennas each have an interruption. The individual antennas are electrically connected in parallel at the interruptions. At least one of the interruptions is bridged by a capacitive element, wherein the capacitive element has a capacitance value at which the individual antennas are decoupled from each other.

However, the individual antennas are galvanically connected via the decoupling circuit, which generates a common mode signal connection.

DE 102 44 172 A1 [6] describes a further decoupling element consisting of a galvanically contact-free decoupling antenna. This decoupling antenna is designed and/or arranged in such a fashion that it inductively couples with the neighboring individual antennas in such a fashion that the inductive coupling between the two relevant individual antennas is minimum. For this reason, one often completely omits decoupling elements in antennas of this type and the individual antennas are only decoupled from each other via the above-described preamplifier decoupling.

Conform Antennas

Flexible antennas are advantageously used for arranging the individual antennas on an area which is optimally adapted to the geometry of the area to be investigated.

U.S. Pat. No. 6,650,926 B1 [7] describes e.g. a phased array antenna configuration consisting of several rigid antenna elements which are connected to each other via a hinge and can thereby be adjusted to the geometry of the patient.

In contrast thereto, US 2008/0238424 A1 [8] describes a phased array antenna configuration, in which the entire RF antenna is mounted to a flexible substrate and is therefore flexible as a whole.

Another possibility of adjusting a phased array antenna to the geometry of the object to be imaged consists in forming the phased array antenna in a modular fashion such that the individual antennas of the phased array antenna can be arranged in correspondence with the desired geometry. An antenna system of this type is described in U.S. Pat. No. 6,084,411 [9].

All of these approaches have one common problem. Shaping of an antenna array or relocating individual antennas of an antenna array changes the mutual coupling of the individual antennas, in consequence of which the decoupling elements must be readjusted for minimizing the coupling of the individual antennas.

It is the underlying object of the device in accordance with the invention to define individual antenna modules, which can be arranged around the measuring volume in a simple fashion, which are also electromagnetically decoupled from each other, and which can preferably be positioned close to the measuring volume in order to ensure that the received MRI image has the highest possible signal-to-noise ratio.

SUMMARY OF THE INVENTION

This object is achieved in that the individual antennas are connected to each other via decoupling elements and the decoupling elements are mounted to the support body and cannot be removed therefrom.

It is therefore desirable that 1. the phased array antenna is flexible in some form or another such that all individual antennas of the array can be positioned as closely as possible to the object and the phased array antenna thereby fits a plurality of different object sizes and shapes.

2. the flexibility described under item 1 is achieved in such a fashion that the individual elements of the phased array antenna do not have to be deformed.

3. decoupling of the individual antennas is guaranteed despite the flexibility described under item 1.

In the present invention, the objects listed above are achieved by using an antenna configuration, which is part of a magnetic resonance apparatus and is designed as a phase-controlled array, wherein the antenna configuration comprises at least two individual antennas which are each formed from at least one conductor loop, one tuning network, one matching network and advantageously one detuning network, wherein the tuning network contains at least one tuning capacitance, the matching network contains at least one matching capacitance, and the detuning network advantageously contains at least one diode, and wherein the individual antennas are connected to each other through decoupling elements, characterized in that only the decoupling elements are fixed to a support body, and the individual antennas are each combined into separate modules which can be positioned on and mounted to the support body and be removed from the support body without being destroyed. The matching geometry can be constructed in a modular fashion by providing different support bodies.

DESCRIPTION OF THE PREFERRED EMBODIMENT

Figure 1:
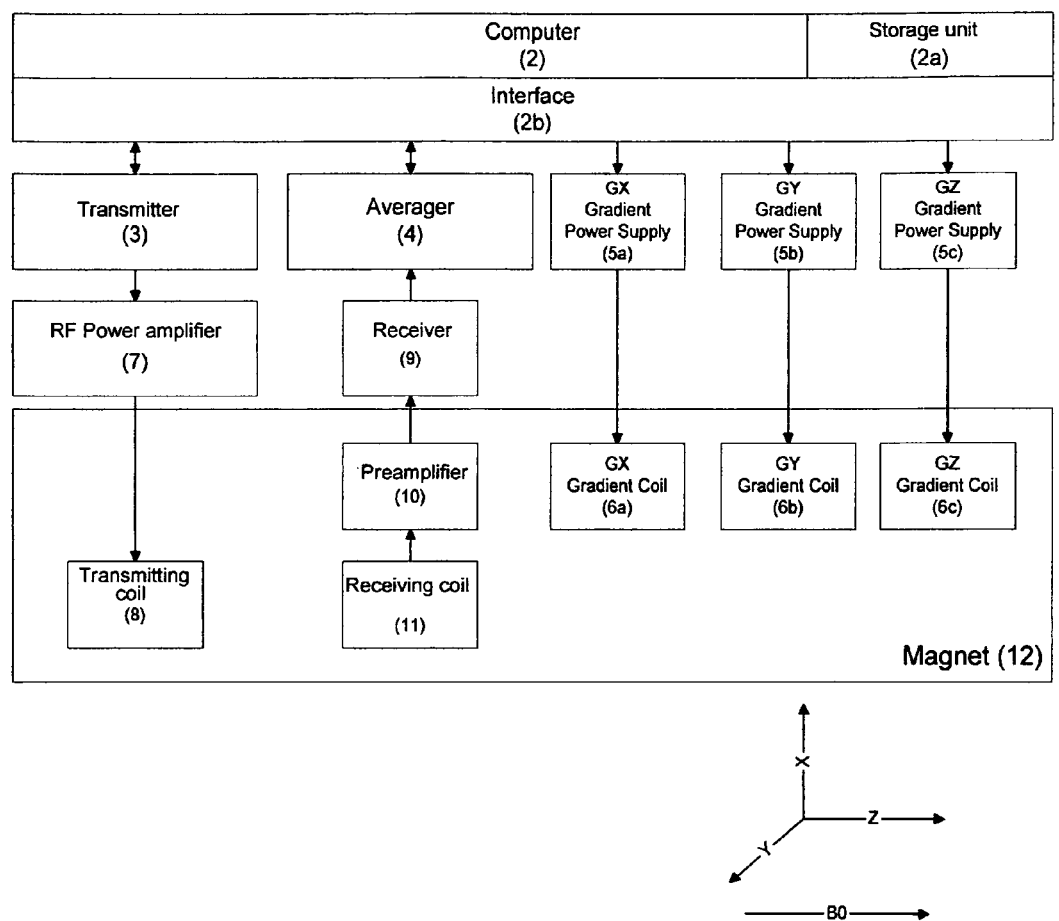
FIG. 1 shows a block diagram MRI system.
Figure 2:
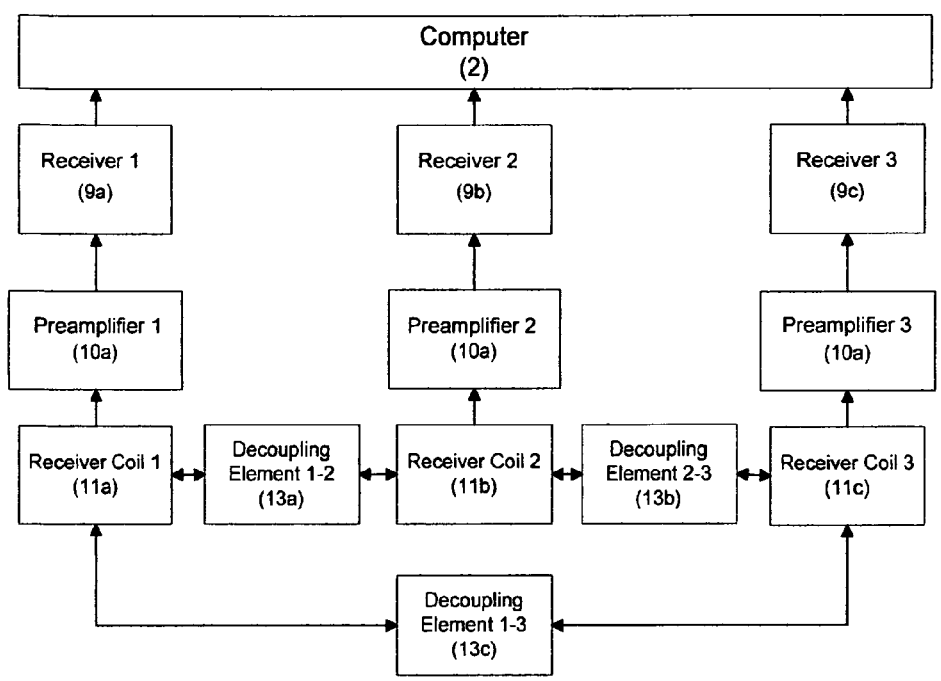
FIG. 2 shows a block diagram phased array antenna.

FIG. 1 is a simplified block diagram of the substantial components of a magnetic resonance imaging (MRI) system which is suitable for use with an antenna configuration described in the present invention.

The system consists of a computer which is connected to a storage unit and to an interface unit.

A radio frequency (RF) transmitter, an RF receiver and power supplies for the gradients are connected to the computer via the interface unit.

The power supply of the gradients supplies the gradient coils which generate the magnetic fields Gx, Gy and Gz with a gradient in the X, Y, and Z directions over the object to be imaged.

The RF transmitter is triggered via computer pulses, thereby generating the RF pulses of corresponding modulation in order to excite an MR signal in the object.

The RF pulses are amplified in an RF power amplifier to powers of between some hundred watts to several kilowatts in dependence on the imaging method, and are transmitted to the transmitting antenna. Larger sample volumes require higher power, such as e.g. for generating whole-body MR images and in cases where short pulses are required for exciting large NMR frequency bandwidths.

The RF pulses irradiated by the transmitting antenna induce an MR signal in the object which is to be investigated.

The MR signal is received by the receiving antenna, is amplified in a low-noise preamplifier and passed on to the receiver where processing of the signal is continued (e.g. further amplified, filtered, mixed, averaged, etc.).

One alternative configuration comprises several receiving antennas, wherein each receiving antenna is connected via a connecting cable to its own low-noise preamplifier which, in turn, is connected to its own receiver.

The signal is then digitized and transmitted via the interface unit to the computer where the signal is further processed. The preamplifier and the receiver are protected against the high RF transmitting pulses by active switch-off or passive filters.

Some MR systems utilize the same antenna both for transmitting and for receiving the RF signals. It is alternatively possible to use separate antennas for transmitting and for receiving the RF signal. In both cases, the magnetic field B1 generated by the antennas is orthogonal to the static magnetic field B0.

The gradient coils generate magnetic field gradients Gx, Gy and Gz which are monotonic and as linear as possible over the sample volume. Non-monotonic gradient fields over the sample volume generate artefacts in the MR image, which are known as "Aliasing". Non-linear gradients generate geometric distortions of the MR image.

In clinical applications, MRI systems are used to generate images of different body regions of individuals of widely varying sizes. For this reason, different receiving antennas are required, which must also be exchanged with corresponding frequency. Exchanging of the receiving antennas is time-consuming and the provision of separate receiving antennas for each application is very expensive.

The present invention now describes an antenna system consisting of several individual antennas which can be assembled in a modular fashion to thereby form a phased array antenna.

The inventive antenna configuration, which is part of a magnetic resonance apparatus and is designed as phase-controlled array, is described below. The antenna configuration thereby comprises at least two individual antennas, wherein the individual antennas are connected to each other by decoupling elements, characterized in that only the decoupling elements are fixed to a support body and the individual antennas are each combined into separate modules which are positioned on and fixed to the support body and can be removed from the support body without being destroyed.

The geometry that suits the object to be imaged can therefore be assembled by providing different support bodies.

Figure 4:
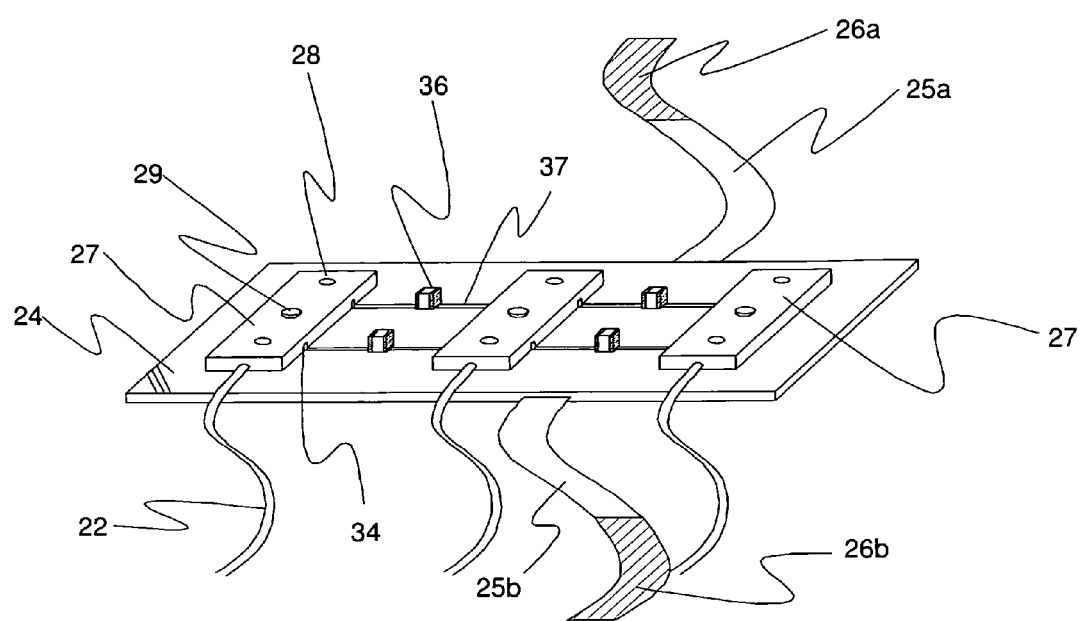
FIG. 4a shows a modular MRI phased array antenna.
FIG. 4b shows a support body of a modular phased array antenna.
FIG. 4c shows individual antennas of a modular phased array antenna.
Figure 4:
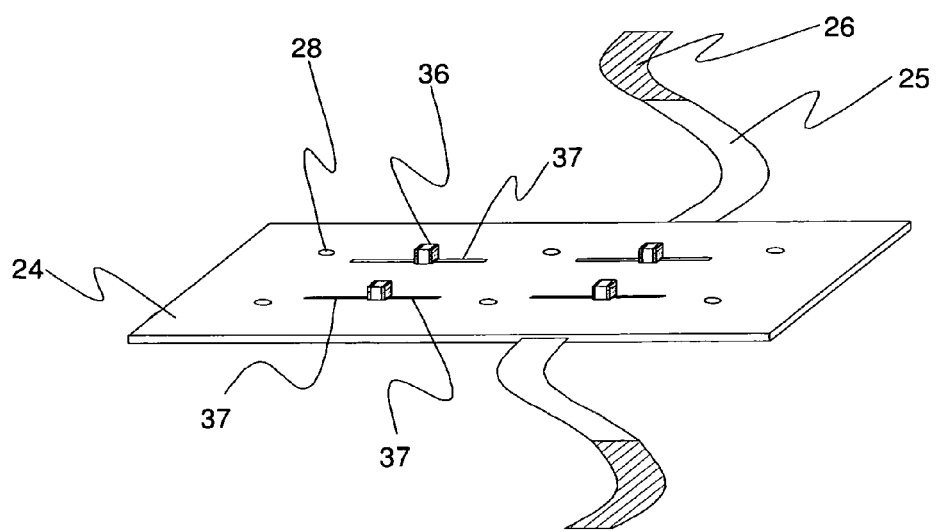
Figure 4:
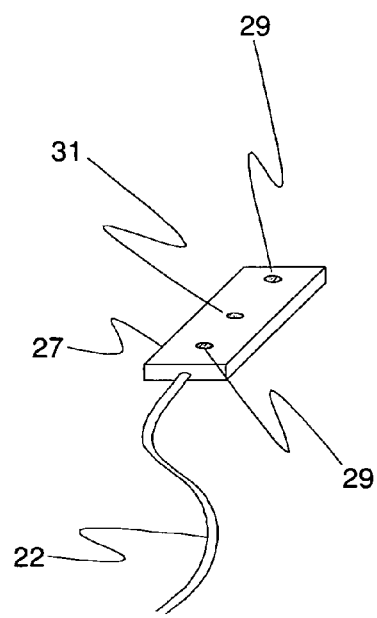

FIG. 4a) shows the above-mentioned antenna system in correspondence with the present invention, when the individual antennas are mounted to the support body.

FIG. 4b) shows a support body without individual antenna modules. And FIG. 4c) shows one individual antenna module.

The Individual Antenna Module

Figure 3:
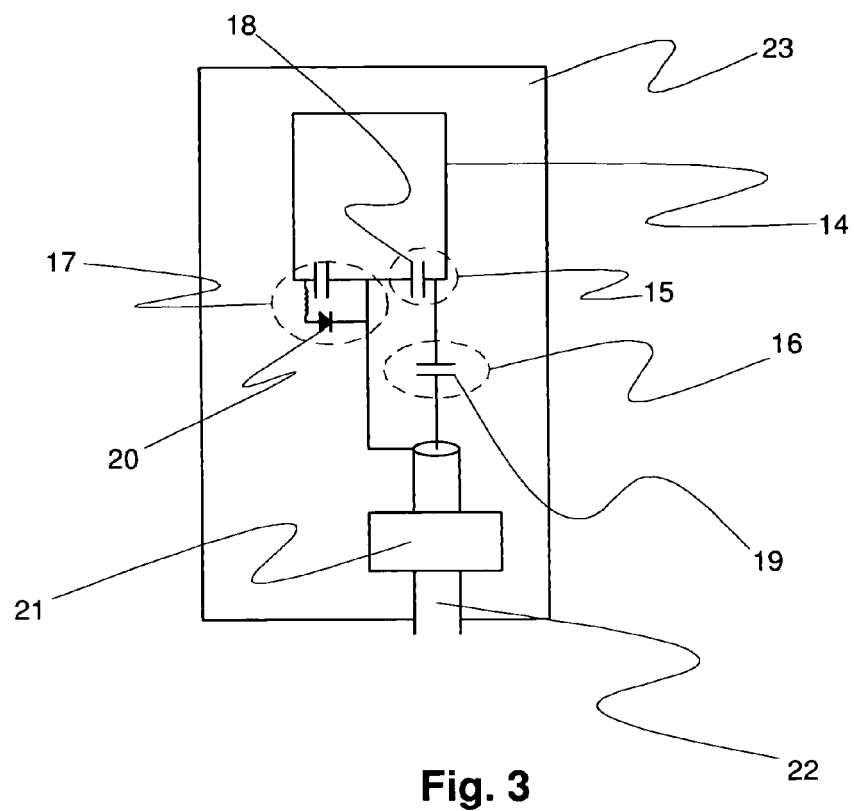
FIG. 3 shows a schematic view of an individual antenna module.

FIG. 3 shows a schematic view of an individual antenna module. The individual antenna consists of at least one conductor loop, one tuning network, one matching network and advantageously one detuning network, wherein the tuning network contains at least one tuning capacitance, the matching network contains at least one matching capacitance and the detuning network advantageously contains at least one diode. The individual antenna itself is located in a rigid housing. The housing is designed in such a fashion that it can be positioned on and mounted to the support body described below. In the specific case described herein, this includes two bores for receiving positioning pins of the support body and a hole through which the individual antenna module can be mounted to the support body by means of a knurled screw. However, other possibilities of positioning and mounting of the individual antenna modules to the support body are also feasible.

The Support Body

Figure 5:
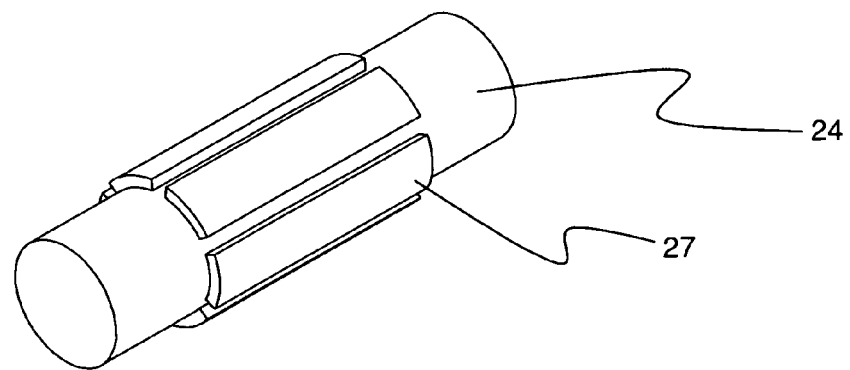
FIG. 5 shows different geometries of support bodies.
Figure 5:
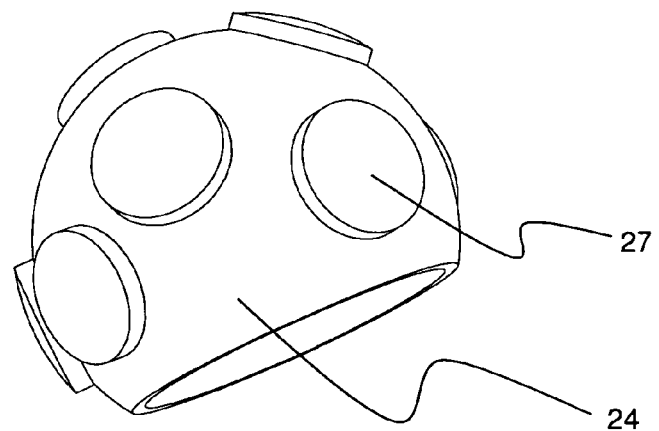

The support body illustrated in FIG. 4b) defines the geometry of the antenna array. The support body is produced from MR compatible, stable material (e.g. glass-fiber reinforced epoxy resin). The support body of FIG. 4b) has a planar geometry. The geometry of the support body, however, is not limited thereto, rather may have any geometry that is adjusted to the geometry of the object to be imaged. FIGS. 5a) & b) illustrate further feasible geometries for support bodies. FIG. 5a) shows a cylindrical support body of the type used e.g. for an antenna configuration which would be used for generating whole-body MRI images or MRI images of extremities.

FIG. 5b) shows an approximately spherical support body with a cut-out which would be used for generating MRI images of a head.

Figure 6:
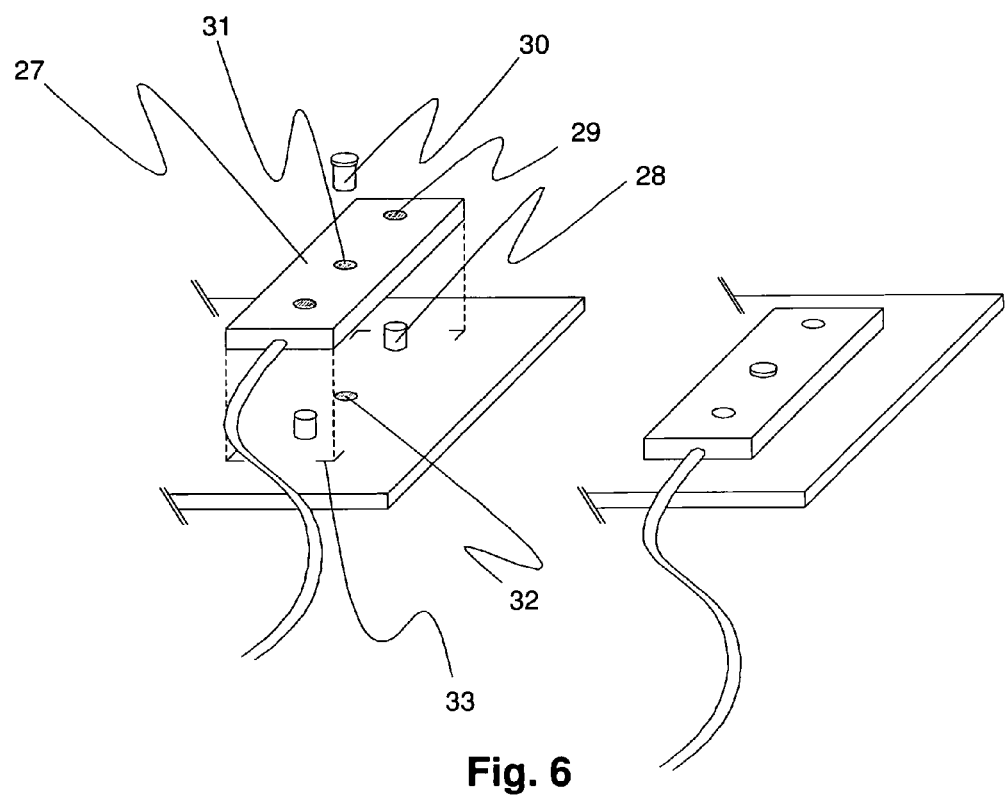
FIG. 6 shows a device for mounting individual antennas to the support body.

Devices for mounting the support body to the object to be imaged are advantageously also provided on the support body such as (elastic) bands, Velcro fasteners, snap locks or the like. In any case, however, there are several devices on the support body, which are used for mounting and positioning the individual antennas on the support body. FIG. 6 shows a simple design of such a device for mounting and positioning an individual antenna on/to the support body, which consists of two pins in the support body, which fit into two bores in the individual antenna module, thereby positioning the latter with respect to the support body, and of a knurled screw for fixing the individual antenna module to the support body. The individual antenna module can be easily released from the support body by releasing the knurled screw, and can be mounted to another support body, if necessary.

Figure 7:
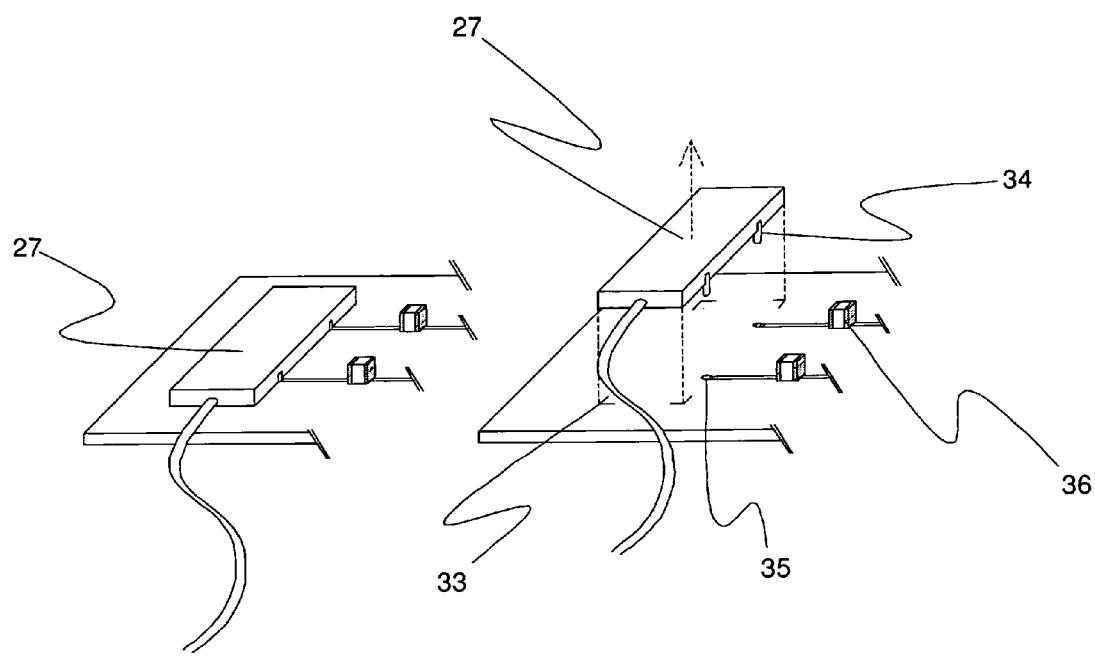
FIG. 7 shows decoupling capacitances as decoupling elements.

In any case, there are also decoupling elements on the support body, which are used to minimize coupling between the individual antenna modules. In the specific embodiment illustrated in FIG. 4, the mentioned decoupling elements consist of contact sleeves, short conductor paths and capacitances. This is illustrated in more detail in FIG. 7. There are electric contact pins on the individual antenna module, which are inserted into the corresponding contact sleeves on the support body upon mounting of the individual antenna module to the support body. This produces an electrical connection between the individual antenna module and the conductor paths on the support body. The individual antenna modules are thereby advantageously electrically connected to each other. "Advantageously" thereby means that coupling of the neighboring individual antenna modules is minimized in this fashion.

Figure 8:
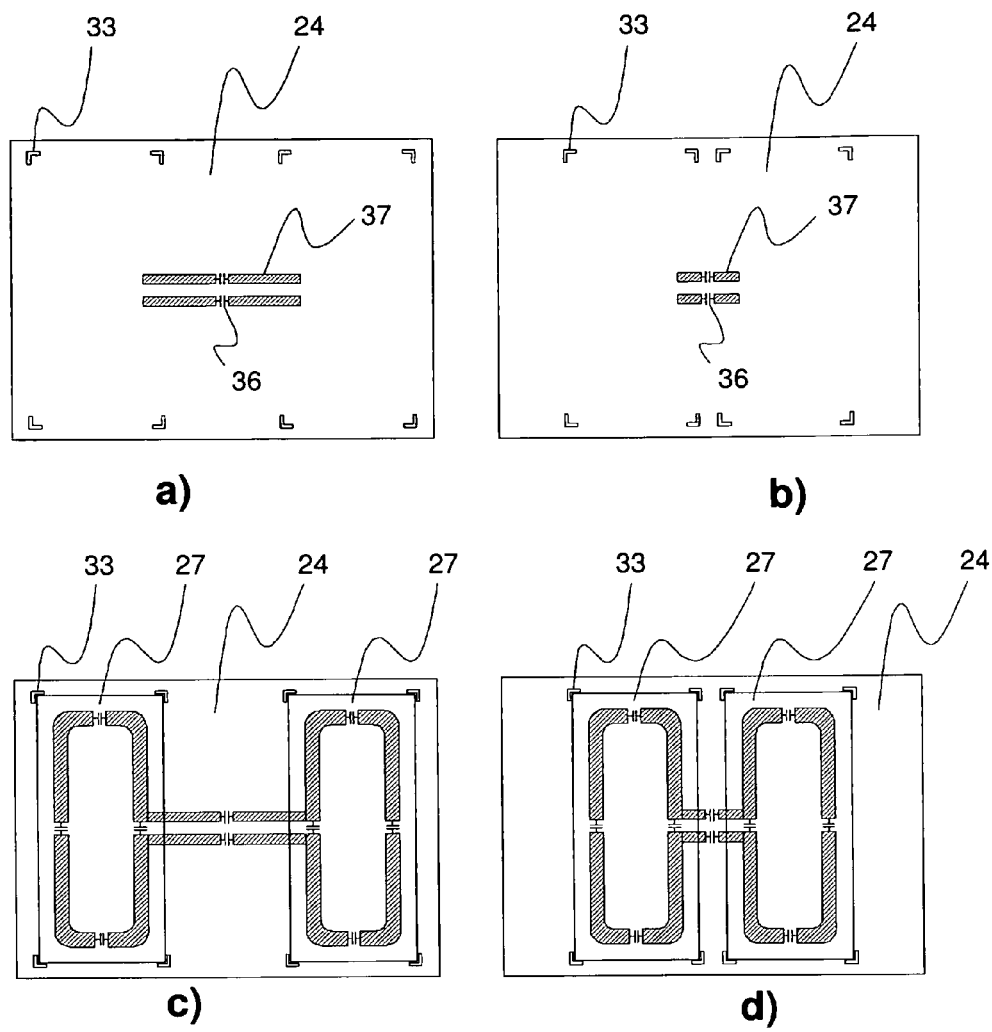
FIG. 8 shows the inventive antenna configuration with capacitances as decoupling elements.

FIG. 8 shows the use of different support bodies and the idea of decoupling elements that belong to the support body in another more schematic view.

FIG. 8a) and FIG. 8b) show two different support bodies. The individual antenna modules of the support body illustrated in FIG. 8b) thereby have a smaller separation from each other than those of the support body illustrated in FIG. 8a). The coupling of two antennas disposed closer together is larger, for which reason the decoupling capacitances on the support body of FIG. 8b) will have a higher capacitance value than the decoupling capacitances on the support body in FIG. 8a). FIGS. 8c) and d) show the respective support bodies of FIGS. 8a) and b) with mounted individual antenna modules.

Figure 9:
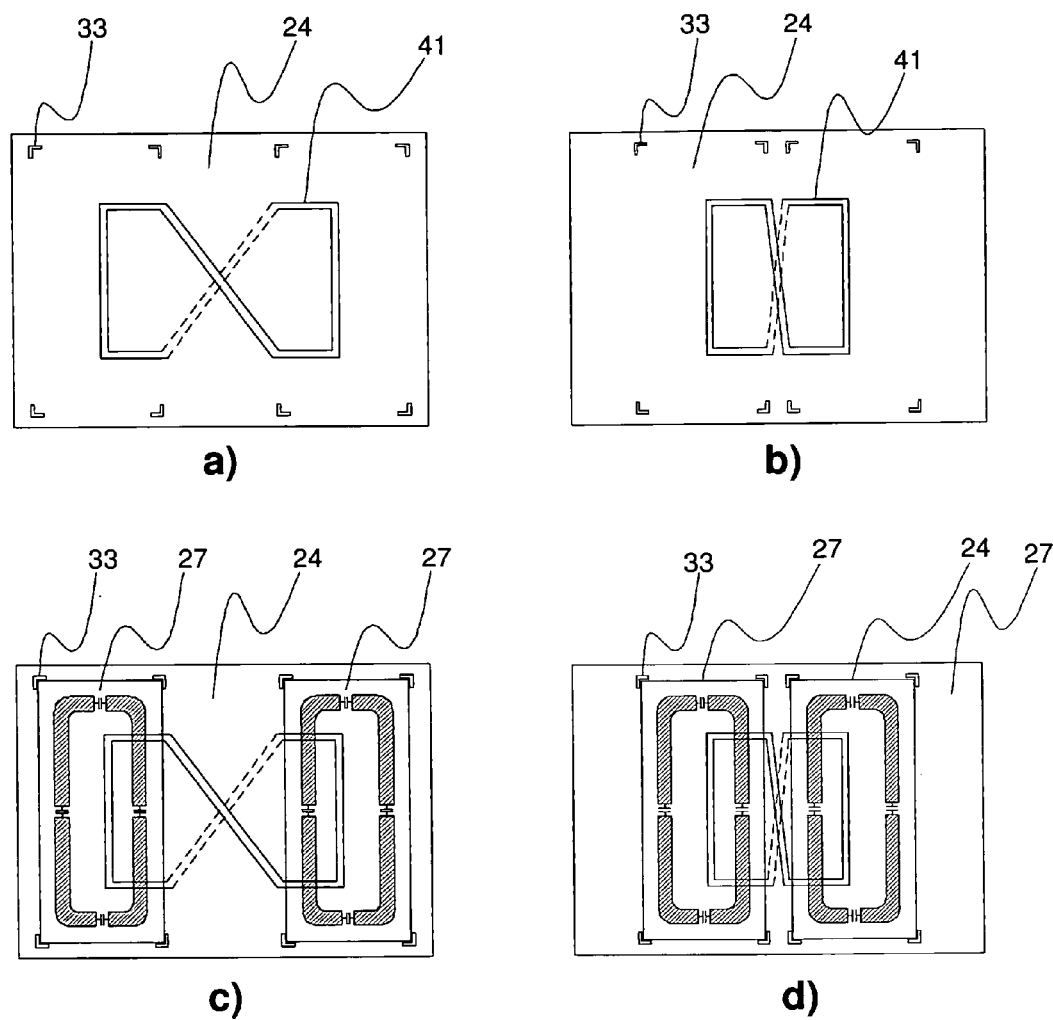
FIG. 9 shows an inventive antenna configuration with butterfly antennas as decoupling elements.

FIGS. 9a) and b) represent a further possible embodiment of the invention. FIGS. 9a) and 9b) show two different support bodies. The individual antenna modules of the support body illustrated in FIG. 9b) have a smaller separation from each other than those of the support body illustrated in FIG. 9a).

In this case, the decoupling elements on the support bodies only consist of a closed conductor path in the shape of a butterfly and need not be electrically contacted with the individual antenna modules. This embodiment of decoupling elements is advantageous in that galvanic contact between individual antenna module and decoupling element is not necessary. The idea of using a conductor loop having the shape of a butterfly as decoupling element is not new and is described extensively i.a. in DE102 44 172 A1. Also in this case, the coupling of two antennas disposed closer together is larger. To compensate for the coupling of the two individual antennas, the butterfly antenna of FIG. 9d) will therefore overlap the individual antenna module to a greater extent than the butterfly antenna of FIG. 9c).

Figure 10:
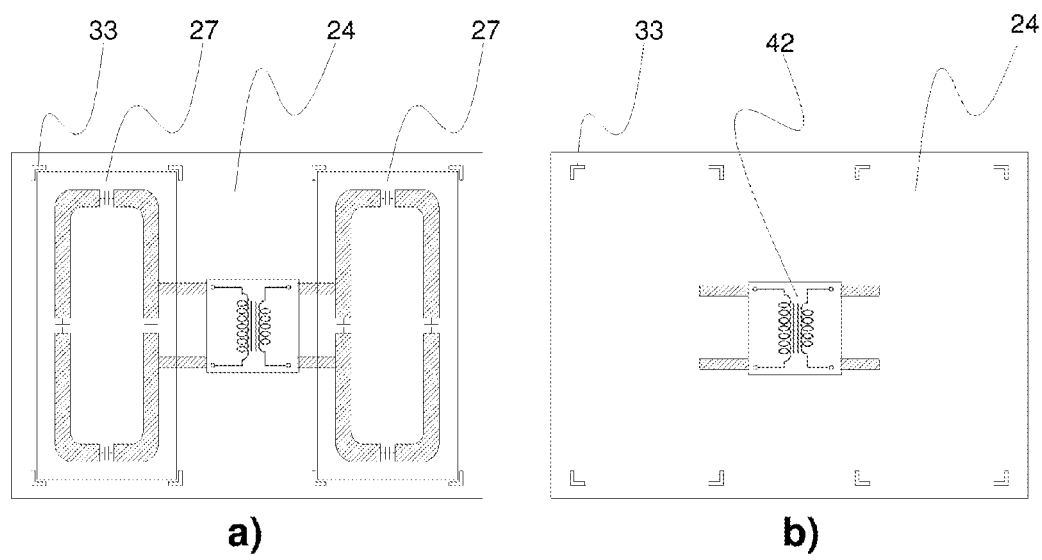
FIG. 10 shows an inventive antenna configuration with transformers as decoupling elements.

FIGS. 10a) and b) represent a further possible embodiment of the invention, wherein in this case, the decoupling element is designed as a transformer. FIG. 10a) thereby represents the support body with the transformer mounted thereon. FIG. 10b) shows two individual antenna modules mounted to the support body, which are in contact with the connectors of the transformer and are therefore decoupled.

Figure 11:
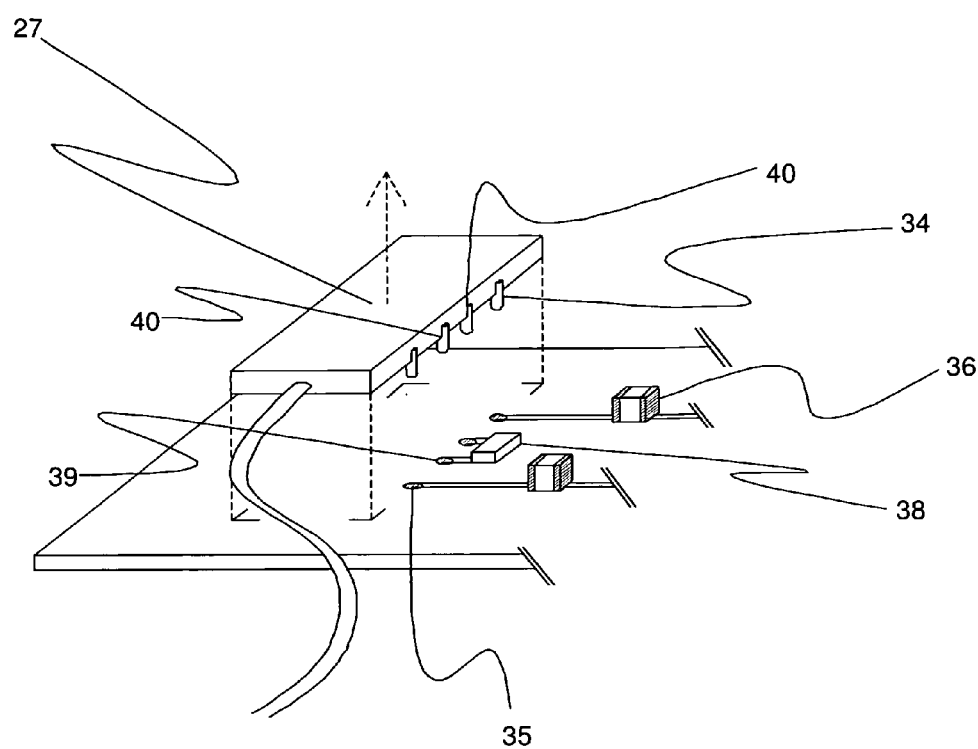
FIG. 11 shows a support body with encoding element

In one somewhat more complex embodiment of the present invention, the support body additionally has an encoding element for each individual antenna module in addition to the above-described elements. In the specific case illustrated in FIG. 11, this encoding element consists of a resistance. The magnitude of the resistance differs in dependence on the position on the support body and in dependence on the support body geometry. This means that the resistance value encodes the support body geometry and the individual antenna position on the support body. Moreover, there is an electrical connection between the two connectors of the encoding resistance and the computer. One or more capacitive elements of the individual antenna modules (in particular e.g. the matching capacitances) are furthermore realized in the form of capacitance diodes.

This means that the capacitance of these elements can be adjusted by changing the voltage applied across the element. Moreover, there is an electrical connection between the two connectors of each capacitance diode and one respective voltage source controlled by the computer. This device permits adjustment of certain capacitance values of the different individual antenna modules in dependence on the support body geometry and on the position of the individual antenna module on the support body by means of the method described below.

A method for adjusting the capacitance diodes in the individual antenna modules by means of the above-described device:

Each encoding element on the support body is read out by the computer via the respective electrical connection, and is compared with a previously generated list of resistance values. This list uniquely allocates one voltage value to each resistance value. The computer then controls the corresponding voltage sources in such a fashion that the corresponding voltages are applied across the respective capacitance diodes, whereby the capacitance diodes assume a certain capacitance value. The voltage values entered in the list were previously and uniquely determined such that changes in the adjustment of the individual oscillating circuits, which result from the different arrangement of the individual antenna modules, are corrected.

One concrete example of the above-described invention is given below.

The object is an MRI investigation of the abdomen of mice.

Towards this end, a phased array antenna with 6 individual elements may be used, which are arranged on a cylinder jacket surface. This is schematically illustrated in FIG. 5a).

In order to have coils which are suited for mice of different sizes, 6 separate individual antenna modules and a set of e.g. 3 support bodies of different sizes are provided in accordance with the present invention.

From the set of support bodies, that cylinder can then be selected, into which the mouse to be investigated just fits. The 6 antenna modules are subsequently mounted to this support body. This obtains the desired 6-fold phased array antenna of optimum size for the desired investigation.

The decoupling elements mounted to the support body thereby ensure that the individual antennas are optimally decoupled.

LIST OF REFERENCES

[1]: U.S. Pat. No. 4,825,162
[2]: DE 38 20 168 A1
[3]: U.S. Pat. No. 5,216,368
[4]: DE 41 13 120 C2
[5]: DE 10 2004 046 188 A1
[6]: DE 102 44 172 A1
[7]: U.S. Pat. No. 6,650,926 B1
[8]: US 2008/0238424 A1
[9]: U.S. Pat. No. 6,084,411

| List of Reference Numerals | |
|---|---|
| 1 | MRI system |
| 2 | computer |
| 2a | interface |
| 2b | Disc storage |
| 3 | transmitter |
| 4 | averager |
| 5a | Gx gradient current supply |
| 5b | Gy gradient current supply |
| 5c | Gz gradient current supply |
| 6a | Gx gradient coil |
| 6b | Gy gradient coil |
| 6c | Gz gradient coil |
| 7 | RF power amplifier |
| 8 | Transmitting antenna |
| 9 | receiver |
| 10 | preamplifier |
| 11 | Receiving antenna |
| 12 | magnet |
| 13a-c | Schematic illustration of a decoupling element |
| 14 | Conductor loop of the individual antenna module |
| 15 | Tuning network |
| 16 | Matching network |
| 17 | Detuning network |
| 18 | Tuning capacitance |
| 19 | Matching capacitance |
| 20 | diode |
| 21 | Balun/standing wave trap |
| 22 | RF cable |
| 23 | Housing of the individual antenna element |
| 24 | Support body |
| 25a-b | Band for mounting the support body to the object |
| 26a-b | Velcro fastener for mounting the support body to the object |
| 27 | Individual antenna module |
| 28 | Pin of the support body for positioning the individual antenna module with respect to the support body |
| 29 | Guide hole in the individual antenna module for receiving pin 28 |
| 30 | Knurled screw |
| 31 | Hole in the individual antenna module for knurled screw |
| 32 | Thread in the support body for the knurled screw |

-continued

List of Reference Numerals

| | |
|---|---|
| 33 | Marking on the support body, which shows the position of the individual antenna module |
| 34 | Contact pin on the individual antenna module |
| 35 | Contact sleeve for contact pin |
| 36 | Decoupling capacitance |
| 37 | Conductor path |
| 38 | Encoding resistance |
| 39 | Contact sleeve for contact pin for encoding resistance |
| 40 | Contact pin for encoding resistance |
| 41 | Conductor loop in the form of a butterfly |
| 42 | Transformer |

I claim:

1. An antenna configuration, designed as a phase-controlled array for use in a magnetic resonance apparatus, the antenna configuration comprising:
a support body;
a first antenna module, said first antenna module comprising at least one first conductor loop, at least one first tuning network and at least one first matching network, said first tuning network having at least one first tuning capacitance and said first matching network having at least one first matching capacitance, wherein said first antenna module is mounted to said support body to be removable therefrom in a non-destructive fashion;
a second antenna module, said second antenna module comprising at least one second conductor loop, at least one second tuning network and at least one second matching network, said second tuning network having at least one second tuning capacitance and said second matching network having at least one second matching capacitance, wherein said second antenna module is mounted to said support body to be removable therefrom in a non-destructive fashion; and
decoupling elements disposed between and connecting said first antenna module and said second antenna module, wherein said decoupling elements are mounted to said support body in an undetachable fashion.

2. The antenna configuration of claim 1, wherein said decoupling elements on said support body are designed in a form of conductor paths having a butterfly geometry.

3. The antenna configuration of claim 1, wherein said decoupling elements on said support body are designed in a form of capacitances.

4. The antenna configuration of claim 1, wherein said decoupling elements on said support body are designed in a form of inductive decoupling coils.

5. The antenna configuration of claim 1, wherein said decoupling elements on said support body are designed in a form of transformers.

6. The antenna configuration of claim 1, wherein the configuration has a detuning network which contains at least one diode.

7. The antenna configuration of claim 1, wherein said support body is additionally provided with an encoding element, which regulates a voltage supply of capacitance diodes in individual antenna elements.

8. A system for modular arrangement of identical antenna modules for forming the antenna configuration of claim 1, wherein different support bodies are provided having decoupling elements fixed thereto, antenna modules being mounted to said individual support bodies in a modular fashion, wherein said decoupling elements mounted to said support bodies are selected in such a fashion that decoupling of individual antennas is minimized.

9. The system of claim 8, wherein said support bodies are designed as cylinders of different sizes.

* * * * *